(12) United States Patent
Zhang et al.

(10) Patent No.: US 12,201,006 B2
(45) Date of Patent: Jan. 14, 2025

(54) DISPLAY PANEL INCLUDING PHASE RETARDATION COEFFICIENT OF THE SUPPORT LAYER CORRESPONDING TO THE LIGHT TRANSMITTING AREA IS LESS THAN THE SUPPORT LAYER CORRESPONDING TO THE BONDING AREA OF THE FLEXIBLE SUBSTRATE

(71) Applicant: Wuhan China Star Optoelectronics Semiconductor Display Technology Co., Ltd., Hubei (CN)

(72) Inventors: Yunti Zhang, Hubei (CN); Dong Zhan, Hubei (CN); Hanning Yang, Hubei (CN); Xin Liu, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/283,568

(22) PCT Filed: Feb. 26, 2021

(86) PCT No.: PCT/CN2021/078116
§ 371 (c)(1),
(2) Date: Apr. 8, 2021

(87) PCT Pub. No.: WO2022/156040
PCT Pub. Date: Jul. 28, 2022

(65) Prior Publication Data
US 2024/0023417 A1    Jan. 18, 2024

(30) Foreign Application Priority Data
Jan. 20, 2021 (CN) .......................... 202110072597.0

(51) Int. Cl.
*H10K 59/80* (2023.01)
*H10K 77/10* (2023.01)

(52) U.S. Cl.
CPC ....... *H10K 59/8791* (2023.02); *H10K 77/111* (2023.02); *H10K 59/8794* (2023.02)

(58) Field of Classification Search
CPC ............. H10K 59/8791; H10K 77/111; H10K 59/8794; H10K 59/873; H10K 59/65;
(Continued)

(56) References Cited

U.S. PATENT DOCUMENTS

2018/0019417 A1* 1/2018 Andou ................ H05K 1/0269
2020/0126459 A1* 4/2020 Wang .................... G09G 3/035

FOREIGN PATENT DOCUMENTS

CN    1274996    11/2000
CN    107001127    8/2017
(Continued)

*Primary Examiner* — Ermias T Woldegeorgis

(57) ABSTRACT

A display device including a display panel and a support layer is provided. The display panel has a light-transmitting area and a bonding area connected to the light-transmitting area. The support layer includes a first support layer and a second support layer, where the first support layer has a first portion corresponding to the light-transmitting area, the second support layer has a second portion corresponding to the bonding area, and an optical phase retardation coefficient of the first portion is less than an optical phase retardation coefficient of the second portion.

20 Claims, 4 Drawing Sheets

(58) Field of Classification Search
CPC ............. H10K 59/121; H10K 59/8793; H10K 50/844; H10K 50/858; H10K 59/10
See application file for complete search history.

(56) References Cited

FOREIGN PATENT DOCUMENTS

| | | |
|---|---|---|
| CN | 108388847 | 8/2018 |
| CN | 108666357 | 10/2018 |
| CN | 208862900 | 5/2019 |
| CN | 10071156 | 7/2019 |
| JP | 2014-164084 | 9/2014 |

\* cited by examiner

DISPLAY PANEL INCLUDING PHASE RETARDATION COEFFICIENT OF THE SUPPORT LAYER CORRESPONDING TO THE LIGHT TRANSMITTING AREA IS LESS THAN THE SUPPORT LAYER CORRESPONDING TO THE BONDING AREA OF THE FLEXIBLE SUBSTRATE

RELATED APPLICATIONS

This application is a National Phase of PCT Patent Application No. PCT/CN2021/078116 having International filing date of Feb. 26, 2021, which claims the benefit of priority of Chinese Patent Application No. 202110072597.0 filed on Jan. 20, 2021. The contents of the above applications are all incorporated by reference as if fully set forth herein in their entirety.

FIELD AND BACKGROUND OF THE INVENTION

This application relates to the field of display technology, and in particular to a display device.

With changes in people's aesthetics and development of mobile terminal products, full-screen design is an inevitable trend in development of terminal products. Based on a flexible OLED panel, a bonding area can be bent to a backside of a screen by using a pad bending technology to achieve a narrower bottom frame. Using under-screen optical or ultrasonic fingerprint technology, screen sound technology, and under-screen camera technology, a sensor can be placed under the screen to further increase a screen-to-body ratio.

There are two ways to realize a camera-under-screen solution, which are blind hole solution and through-hole solution. Compared with a through-hole screen, a blind-hole screen can hide a camera under a screen, and the screen can display normally. This design is beneficial to increase a screen-to-body ratio and thus has a broader market prospect. In the blind-hole screen, a support layer and a heat dissipation layer are disposed under a display panel. The support layer has functions of supporting and protecting the display panel, and because the support layer in the bonding area has a small thermal expansion, during a die bonding process, bonding failure caused by a volume change of the support layer will not occur. The heat dissipation layer is used for heat dissipation, and it is usually an opaque layer. In order to meet lighting requirements of the camera, a drilling process will be performed on the heat dissipation layer. The support layer itself has a certain degree of light transmittance, so there are usually two treatment ways for the support layer: one is to retain an entire portion of the support layer; in this way, support and protection effect of the support layer on the display panel in a blind hole area and the bonding area can be maintained. However, light will cause serious interference after passing through the support layer, forming bright and dark stripes, which further affects lighting of the camera. The other is to perform a drilling process on the blind hole area of the support layer to prevent the influence of light on the support layer. However, this solution will cause the display panel in the blind hole area to lack protection and support, and compression resistance of the display panel will not meet demand.

The support layer of the current display device will cause the light to form bright and dark stripes, which will affect the lighting effect of the camera. However, if a drilling process is performed on the support layer, the compression resistance of the display panel in the blind hole area will be insufficient.

SUMMARY OF THE INVENTION

The present application provides a display device for solving the above technical problems.

The present application provides a display device, which includes: a display panel including a light-transmitting area and a bonding area connected to the light-transmitting area; a support layer disposed on a backside of the display panel, wherein the support layer includes a first support layer and a second support layer, the first support layer includes a first portion corresponding to the light-transmitting area, the second support layer includes a second portion corresponding to the bonding area, and an optical phase retardation coefficient of the first portion is less than an optical phase retardation coefficient of the second portion.

In the display device of the present application, a thermal expansion coefficient of the second portion is less than a thermal expansion coefficient of the first portion.

In the display device of the present application, the optical phase retardation coefficient of the first portion is less than or equal to 100.

In the display device of the present application, material of the first portion includes at least one of cycloolefin polymer, triacetyl cellulose, colorless polyimide, or poly (methyl methacrylate).

In the display device of the present application, the material of the second portion includes polyethylene terephthalate.

In the display device of the present application, the display panel includes a first area, the first area includes the light-transmitting area, and the bonding area is connected to the first area.

In the display device of the present application, the first support layer is disposed corresponding to the first area, and the first portion is an entire region of the first support layer.

In the display device of the present application, an area of the first portion is greater than an area of the light-transmitting area.

In the display device of the present application, the second portion is an entire region of the second support layer.

In the display device of the present application, the display panel further includes a bending area connected between the first area and the bonding area, and the first area is disposed opposite to the bonding area.

In the display device of the present application, the support layer further includes a third support layer disposed corresponding to the first area, the third support layer is provided with a first opening, and the first support layer is disposed in the first opening.

In the display device of the present application, the material of the second support layer and the material of the third support layer both include polyethylene terephthalate.

In the display device of the present application, the support layer further includes a third support layer disposed corresponding to the first area, the third support layer is located on a lower side of the first support layer, the third support layer is provided with a second opening, and the second opening is provided corresponding to the position of the light-transmitting area.

In the display device of the present application, the first support layer is disposed corresponding to the first area, and the second support layer is disposed corresponding to the bonding area.

In the display device of the present application, the first support layer is disposed corresponding to the first area and the bonding area, the second support layer is disposed corresponding to the bonding area, and the second support layer is located on a side of the first support layer away from the display panel.

In the display device of the present application, the display device further includes an anti-reflective film on one side of the support layer, wherein the anti-reflective film is disposed corresponding to the light-transmitting area.

In the display device of the present application, the material of the anti-reflective film includes a submicron-level transparent ceramic material.

In the display device of the present application, the display device further includes a polarizing layer disposed on the display panel, a cover plate layer disposed on the polarizing layer, and a heat dissipation layer disposed on a backside of the support layer, wherein the heat dissipation layer is provided with a third opening corresponding to the light-transmitting area.

In the display device of the present application, the display device further includes an optical component, and the optical component is disposed corresponding to the light-transmitting area.

The application further provides a display device, which includes: a display panel including a first area, a bending area connected to the first area, and a bonding area connected to the bending area, wherein the first area includes a light-transmitting area; a support layer disposed on a backside of the display panel, wherein the support layer includes a first support layer, a second support layer, and a third support layer, the first support layer is disposed corresponding to the first area and the bonding area, the second support layer is disposed corresponding to the bonding area, and the second support layer is located on a side of the first support layer away from the display panel, the third support layer is disposed corresponding to the first area, and the third support layer is located on a side of the first support layer away from the display panel, the third support layer is provided with an opening corresponding to a position of the light-transmitting area, and an optical phase retardation coefficient of the first support layer is less than an optical phase retardation coefficient of the second support layer.

In the display device provided in the present application, by configuring a light phase retardation coefficient of the first portion of the support layer corresponding to the light-transmitting area of the display panel to be less than a light phase retardation coefficient of the second portion of the support layer, the phase retardation effect of the support layer on the light passing through the light-transmitting area is alleviated or eliminated, which prevents light and dark stripes from appearing in the light-transmitting area, and improves the lighting effect of optical components under the screen. Further, compared with a design of drilling the support layer in the light-transmitting area, the present application can improve the compression resistance of the display panel. In addition, the support layer corresponding to the bonding area of the display panel has a smaller thermal expansion coefficient, which prevents a bonding failure due to an excessive expansion and contraction of the support layer during a bonding process, and improves the manufacturing yield and the reliability of the display device.

BRIEF DESCRIPTION OF THE SEVERAL VIEWS OF THE DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the field based on these drawings without doing any creative activity.

DESCRIPTION OF SPECIFIC EMBODIMENTS OF THE INVENTION

The technical solutions in the embodiments of the present application will be clearly and completely described below with reference to the drawings in the embodiments of the present application. Obviously, the embodiments are only a part of the embodiments of the present application, rather than all the embodiments. Based on the embodiments in this application, all other embodiments obtained by those skilled in the art without creative work shall fall within the protection scope of this application.

An embodiment of the present application provides a display device including a display panel and a support layer for supporting the display panel. The display panel has a light-transmitting area and a bonding area connected to the light-transmitting area. The support layer includes a first support layer and a second support layer, where the first support layer has a first portion corresponding to the light-transmitting area, the second support layer has a second portion corresponding to the bonding area, and an optical phase retardation coefficient of the first portion is less than an optical phase retardation coefficient of the second portion. In the embodiments of the present application, the light phase retardation coefficient of the support layer corresponding to the light-transmitting area of the display panel is reduced, so as to alleviate or eliminate the phase retardation effect of the support layer on the light in the light-transmitting area. It prevents the light and dark stripes from appearing in the light-transmitting area, so as to improve the lighting effect of optical components under the screen. In addition, the support layer corresponding to the bonding area of the display panel has a smaller thermal expansion coefficient, which prevents a bonding failure due to an excessive expansion and contraction of the support layer during a bonding process.

Figure 1:
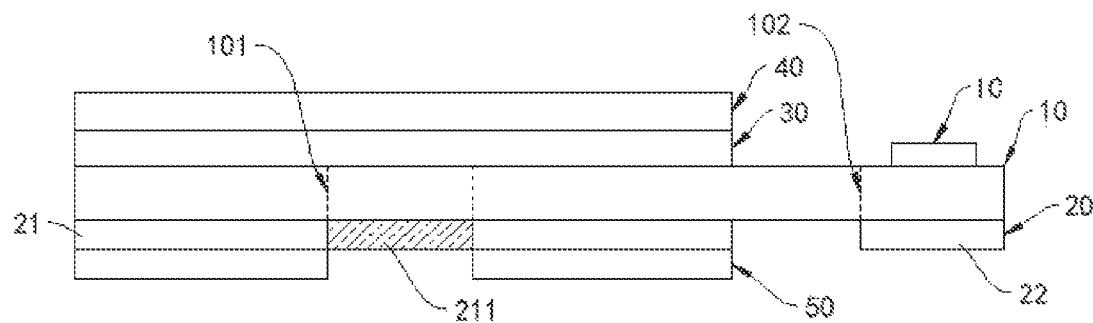
FIG. 1 is a schematic diagram of a first structure of a display device provided by an embodiment of the present application.

Please refer to FIG. 1, which is a schematic diagram of a first structure of a display device provided by an embodiment of the present application. The display device includes a display panel 10, a support layer 20 disposed on a backside of the display panel 10, a polarizer layer 30 disposed on the display panel 10, a cover plate layer 40 disposed on the polarizer layer 30, and a heat dissipation layer 50 disposed on a lower side of the support layer 20. Wherein, the display panel 10 may be an organic light-emitting diode display panel, and the display panel 10 may have flexibility in at least a partial area thereof and can be bent to a backside of the partial area of the display panel 10. The support layer 20 is used to support and protect the display panel 10 to ensure that the display panel 10 maintains a normal working shape under external pressure or heat. The polarizer layer 30 has a polarization effect and is used to adjust the visual effect of the display panel 10, and the polarizer layer 30 may be a monolithic polarizer. The cover plate layer 40 is used to encapsulate and protect various components in the display device to prevent damage from external forces or corrosion by external water vapor, etc., and the cover plate layer 40 may be a glass cover plate. The heat dissipation layer 50 is used to conduct and dissipate the heat in the display device. It prevents heat accumulation from damaging the display device. The heat dissipation layer 50 may be a composite film layer composed of a composite adhesive layer, a metal copper layer, a polyimide layer, and a foam layer.

The display panel 10 includes a light-transmitting area 101 and a bonding area 102 connected to the light-transmitting area 101. It should be noted that display panel 10 is the main body of the display device that performs a display function, and a plurality of pixel units are provided inside. The light-transmitting area 101 has higher light transmittance than other areas of the display panel 10, so as to meet the lighting requirements of the optical components disposed on the lower side of the light-transmitting area 101. In order to achieve the high light transmittance of the light-transmitting area 101, the arrangement density of the pixel units in the light-transmitting area 101 is less than the arrangement density of the pixel units in other areas of the display panel 10 to ensure that light passes through the light-transmitting area 101 smoothly. The bonding area 102 may not have a display function, and a variety of wiring lines are provided inside. The chip IC or flexible circuit board is bonded to the display panel 10 through the bonding area 102, used to provide a driving signal or a control signal for the display panel 10. The method of bonding the chip IC or flexible circuit board to the display panel 10 is the hot-pressing method. Because the hot-pressing method needs to heat the bonding area 102, other functional layers corresponding to the bonding area 102 need to have certain heat resistance, especially the thermal expansion coefficient must be able to meet the requirements of hot pressing. The bonding area 102 may be bent to a backside of the display panel 10 through a bending area to realize the narrow frame design of the display device. The heat dissipation layer 50 includes a third opening corresponding to the light-transmitting area 101.

The support layer 20 is disposed on the backside of the display panel 10 or an opposite side of the light-emitting surface of the display panel 10. The support layer 20 includes a first support layer 21 and a second support layer 22. The first support layer 21 includes a first portion 211 corresponding to the light-transmitting area 101, and the second support layer 22 includes a second portion corresponding to the bonding area 102, and the second portion may be part or all of the second support layer 22. Wherein, an optical phase delay coefficient of the first portion 211 is less than an optical phase delay coefficient of the second portion.

It should be noted that the support layer 20 has light transmittance in at least an area corresponding to the first portion 211. When light passes through the intermediate medium, because the intermediate medium has a phase retardation effect on the light, its phase will change to varying degrees. The greater the phase difference, the greater the light interference effect between the lights, and the bright and dark fringes formed by the emitted light are more serious. In the embodiment of the present application, the first portion 211 is equivalent to the intermediate medium. By adjusting the optical phase delay coefficient of the first portion 211, the optical phase delay coefficient of the first portion 211 is less than that of the second portion, or the optical phase retardation coefficient of the first portion 211 is less than the optical phase retardation coefficient of other areas of the support layer 20 except for the first portion 211. Therefore, the light and dark fringes generated by the phase retardation of the support layer on the light are reduced or eliminated, which is beneficial to improve the lighting effect of the optical components disposed corresponding to the light-transmitting area 101.

Alternatively, an optical phase retardation coefficient of the first portion 211 is less than or equal to 100, and an optical phase retardation coefficient of the second portion is greater than 100. It should be noted that through multiple creative experiments and creative calculations on the basis of the experiments, it is proven that when the light phase retardation coefficient of the first portion 211 is less than or equal to 100, the phase retardation effect on the light will not cause the emitted light to form bright and dark stripes, or have a significant impact on the lighting effect of the optical components under the screen.

Alternatively, the first portion 211 may be made of materials with a low phase retardation coefficient such as cyclic olefin polymer (COP), tri-cellulose acetate (TAC), colorless polyimide (CPI), or poly (methyl methacrylate) (PMMA).

Figure 2:
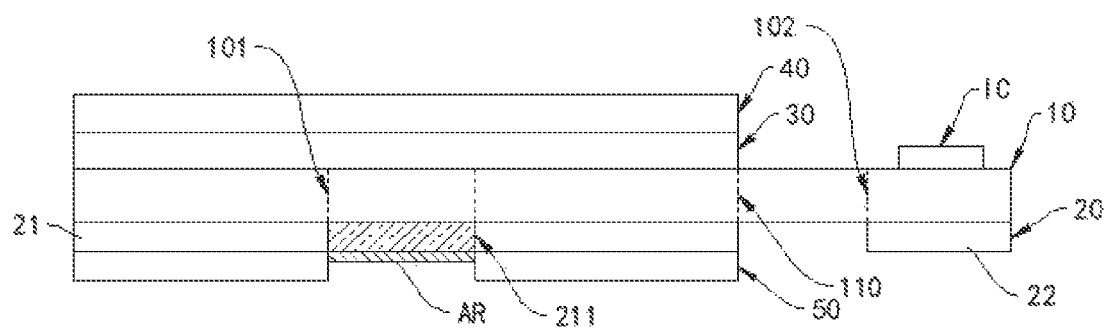
FIG. 2 is a schematic diagram of the structure of the display device shown in FIG. 1 with an anti-reflective film added.

Alternatively, please refer to FIG. 2. The display device further includes an anti-reflective film AR on one side of the support layer 20, and the anti-reflective film AR is disposed corresponding to the light-transmitting area 101 to increase the light transmittance of the display device at the light-transmitting area 101. The anti-reflective film AR can be made of sub-micron-level transparent ceramic materials.

Further, the thermal expansion coefficient of the second portion is less than the thermal expansion coefficient of the first portion 211. It should be noted that the second portion of the second support layer 22 corresponds to the bonding area 102 of the display panel 10, and because the process of bonding the chip IC or flexible circuit board to the bonding area 102 requires adopting a hot-pressing method, the support layer that supports the bonding area 102 needs to have good heat resistance. The thermal expansion coefficient of a material is an indicator that reflects the expansion and contraction performance of the material when it is heated. In this embodiment, the thermal expansion coefficient of the second portion is adjusted so that the thermal expansion coefficient of the second portion is less than the thermal expansion coefficient of the first portion 211, or the thermal expansion coefficient of the second portion is less than the thermal expansion coefficient of other areas of the support layer 20 except for the second portion. Therefore, the display panel 10 not properly bonding to the chip IC or the flexible circuit board due to excessive thermal expansion of the support layer is prevented, which is beneficial to improve the manufacturing yield and reliability of the display device.

Alternatively, the second portion may be made of materials with a relatively low thermal expansion coefficient such as polyethylene terephthalate (PET).

It should be noted that the first portion 211 may not only correspond to the light-transmitting area 101 of the display panel 10, it can also be correspondingly disposed on the backside of other areas of the display panel 10 except for the bonding area 102. The second portion may not only correspond to the bonding area 102 of the display panel 10, but may also be correspondingly disposed on the backside of other areas of the display panel 10 except the light-transmitting area 101.

Figure 3:
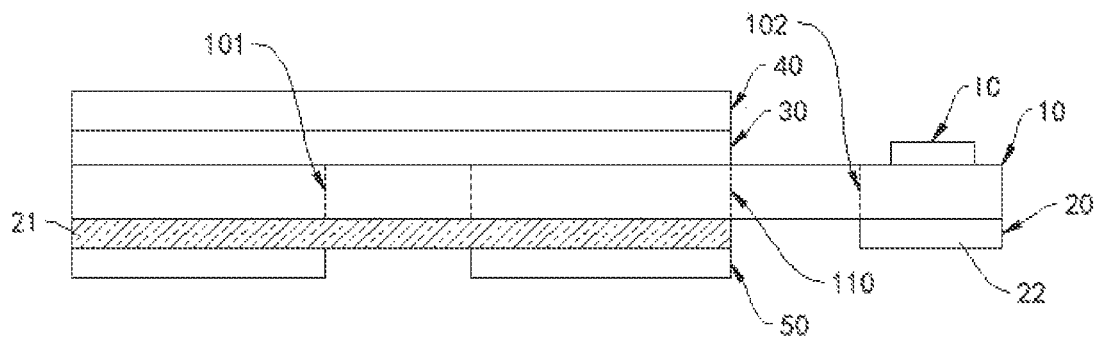
FIG. 3 is a schematic diagram of a second structure of a display device provided by an embodiment of the present application.

In one embodiment, please refer to FIG. 3. FIG. 3 is a schematic diagram of a second structure of a display device provided in an embodiment of the present application. The display device includes a display panel 10, a support layer 20 disposed on the backside of the display panel 10, a polarizer layer 30 disposed on the display panel 10, a cover plate layer 40 disposed on the polarizer layer 30, and a heat dissipation layer 50 disposed on a lower side of the support layer 20. Wherein, the display panel 10 may be an organic light-emitting diode display panel. The display panel 10 may have flexibility in at least a partial area and can be bent to the backside of the partial area of the display panel 10. The support layer 20 is used to support and protect the display panel 10 to ensure that the display panel 10 maintains a normal working shape under external pressure or heat. The polarizer layer 30 has a polarization effect and is used to adjust the visual effect of the display panel 10, and the polarizer layer 30 may be a monolithic polarizer. The cover plate layer 40 is used to encapsulate and protect various components in the display device to prevent damage from external forces or corrosion by external water vapor, etc., and the cover plate layer 40 may be a glass cover plate. The heat dissipation layer 50 is used to conduct and dissipate the heat in the display device. It prevents heat accumulation from damaging the display device. The heat dissipation layer 50 may be a composite film layer composed of a composite adhesive layer, a metal copper layer, a polyimide layer, and a foam layer.

The display panel 10 includes a first area 110 and a bonding area 102 connected to the first area 110, and the first area 110 includes a light-transmitting area 101. The first area 110 may be an area with a display function in the display panel 10. Compared with other areas on the display panel 10, the light-transmitting area 101 has higher light transmittance to meet the lighting requirements of the optical components disposed on the lower side of the light-transmitting area 101. The bonding area 102 may not have a display function, and a variety of wiring lines are provided inside. The chip IC or flexible circuit board is bonded to the display panel 10 through the bonding area 102, used to provide a driving signal or a control signal for the display panel 10. The method of bonding the chip IC or flexible circuit board to the display panel 10 is the hot-pressing method. The bonding area 102 may be bent to a backside of the display panel 10 through a bending area to realize the narrow frame design of the display device. The heat dissipation layer 50 includes a third opening corresponding to the light-transmitting area 101.

The support layer 20 is disposed on the backside of the display panel or an opposite side of the light-emitting surface of the display panel 10. The support layer 20 includes a first support layer 21 and a second support layer 22. The first support layer 21 is disposed corresponding to the first area 110. The first support layer 21 is disposed on the lower side of the light-transmitting area 101. The second support layer 22 is disposed corresponding to the bonding area 102. Wherein, an optical phase retardation coefficient of the first support layer 21 is less than an optical phase retardation coefficient of the second support layer 22.

It should be noted that the first support layer 21 has light transmittance in at least an area corresponding to the light-transmitting area 101. In this embodiment, by adjusting the optical phase retardation coefficient of the first support layer 21, the optical phase retardation coefficient of the first support layer 21 is made less than the optical phase retardation coefficient of the second support layer 22. Therefore, the phase retardation effect of the first support layer 21 on the light is reduced or eliminated. In addition, the light passing through the light-transmitting area 101 is prevented from forming bright and dark stripes, which is beneficial to improve the lighting effect of the optical components disposed corresponding to the light-transmitting area 101.

Alternatively, an optical phase retardation coefficient of the first support layer 21 is less than or equal to 100, and an optical phase retardation coefficient of the second support layer 22 is greater than 100. It should be noted that through multiple creative experiments and creative calculations on the basis of the experiments, it is proven that when the light phase retardation coefficient of the first support layer 21 is set to be less than or equal to 100, the phase retardation effect on the light will not cause the emitted light to form bright and dark stripes, or have a significant impact on the lighting effect of the optical components under the screen.

Alternatively, the first support layer 21 may be made of materials with a low phase retardation coefficient such as cyclic olefin polymer (COP), tri-cellulose acetate (TAC), colorless polyimide (CPI), or poly (methyl methacrylate) (PMMA).

Further, the thermal expansion coefficient of the second support layer 22 is less than the thermal expansion coefficient of the first support layer 21. It should be noted that the second support layer 22 corresponds to the bonding area 102 of the display panel 10, and because the process of bonding the chip IC or flexible circuit board to the bonding area 102 requires adopting a hot-pressing method, the support layer that supports the bonding area 102 needs to have good heat resistance. In this embodiment, the thermal expansion coefficient of the second support layer 22 is adjusted so that the thermal expansion coefficient of the support layer 22 is less than the thermal expansion coefficient of the first support layer 21. By controlling the expansion amount of the second support layer 22 under the condition of hot pressing, it prevents the chip IC or flexible circuit board from being poorly bonded to the display panel 10 due to excessive expansion of the support layer. It is beneficial to improve the manufacturing yield and reliability of the display device.

Alternatively, the second support layer 22 may be made of materials with a relatively low thermal expansion coefficient such as polyethylene terephthalate (PET).

Figure 4:
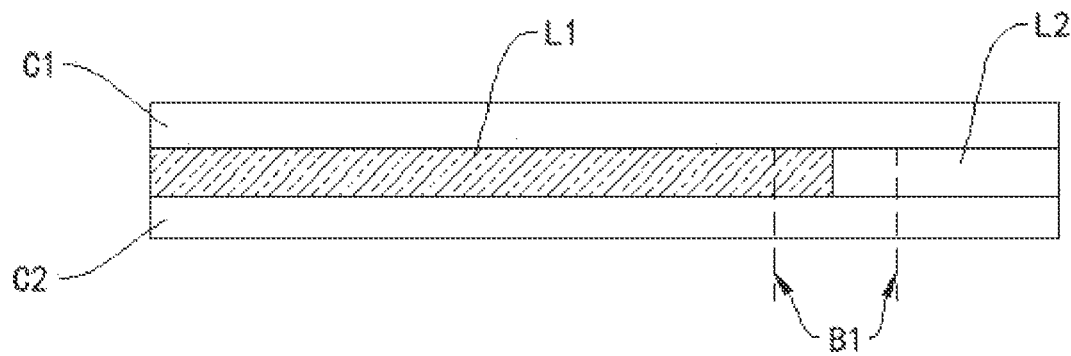
FIG. 4 is a schematic diagram of a structure of a support layer in the display device shown in FIG. 3 during a manufacturing process.

Further, please refer to FIG. 3 and FIG. 4. FIG. 4 is a schematic diagram of a structure of the support layer in the display device shown in FIG. 3 during the manufacturing process. Before the support layer 20 is attached to the display panel 10, a release film C1 and a carrier film C2 are attached to both sides of the support layer 20, respectively. In this embodiment, the method of manufacturing the support layer 20 includes following steps: taking a first raw material including a first splicing layer L1 and a second raw material including a second splicing layer L2, wherein the first splicing layer L1 corresponds to the first support layer 21, and the second splicing layer L2 corresponds to the second support layer 22; removing the release film C1 and the carrier film C2 attached on both sides of the first raw material and the second raw material to obtain the first splicing layer L1 and the second splicing layer L2; attaching the first splicing layer L1 and the second splicing layer L2 side by side between the new carrier film C2 and the release film C1; using a die-cut mold to perform a half-cutting process along a cutting line B1 of the carrier film C2 side until reaching a bonding surface of the release film C1 and the first splicing layer L1 or the second splicing layer L2, wherein the cutting area enclosed by the cutting line B1 includes a connecting seam between the first splicing layer L1 and the second splicing layer L2; removing the cut carrier film C2, and attaching the complete carrier film C2 thereto; removing the release film C1, and respectively attaching the first splicing layer L1 and the second splicing layer L2 thereto corresponding to the first area 110 and the bonding area 102 of the display panel 10; removing the carrier film C2, and the manufacturing of the support layer 20 is completed.

Figure 5:
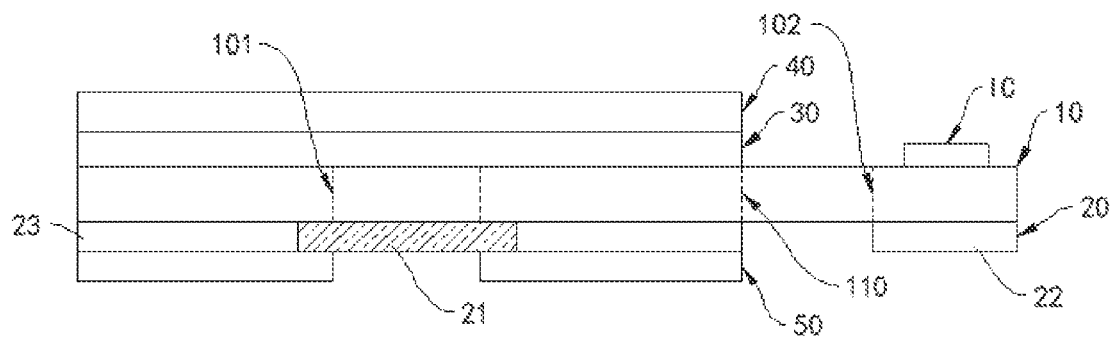
FIG. 5 is a schematic diagram of a third structure of a display device provided by an embodiment of the present application.

In one embodiment, please refer to FIG. 5. FIG. 5 is a schematic diagram of a third structure of a display device provided in an embodiment of the present application. The display device includes a display panel 10, a support layer 20 disposed on a backside of the display panel 10, a polarizer layer 30 disposed on the display panel 10, a cover plate layer 40 disposed on the polarizer layer 30, and a heat dissipation layer 50 disposed on a lower side of the support layer 20. Wherein, the display panel 10 may be an organic light-emitting diode display panel, and the display panel 10 may have flexibility in at least a partial area thereof and can be bent to a backside of the partial area of the display panel. The support layer 20 is used to support and protect the display panel 10 to ensure that the display panel 10 maintains a normal working shape under external pressure or heat. The polarizer layer 30 has a polarization effect and is used to adjust the visual effect of the display panel 10, and the polarizer layer 30 may be a monolithic polarizer. The cover plate layer 40 is used to encapsulate and protect various components in the display device to prevent damage from external forces or corrosion by external water vapor, etc., and the cover plate layer 40 may be a glass cover plate. The heat dissipation layer 50 is used to conduct and dissipate the heat in the display device. It prevents heat accumulation from damaging the display device. The heat dissipation layer 50 can be a composite film layer composed of a composite adhesive layer, a metal copper layer, a polyimide layer, and a foam layer.

The display panel 10 includes a first area 110 and a bonding area 102 connected to the first area 110, and the first area 110 includes a light-transmitting area 101. The first area 110 may be an area with a display function in the display panel 10. Compared with other areas on the display panel 10, the light-transmitting area 101 has higher light transmittance to meet the lighting requirements of the optical components disposed on the lower side of the light-transmitting area 101. The bonding area 102 may not have a display function, and a variety of wiring lines are provided inside. The chip IC or flexible circuit board is bonded to the display panel 10 through the bonding area 102 and is used to provide driving or control signals for the display panel 10. The method of bonding the chip IC or the flexible circuit board and the display panel 10 may be a hot-pressing method. The bonding area 102 can be bent to the backside of the display panel 10 through a bending area to realize the narrow frame design of the display device. The heat dissipation layer 50 includes a third opening corresponding to the light-transmitting area 101.

The support layer 20 is disposed on the backside of the display panel 10 or an opposite side of the light-emitting surface of the display panel 10. The support layer 20 includes a first support layer 21, a second support layer 22, and a third support layer 23. At least a part of the area of the first support layer 21 is disposed corresponding to the light-transmitting area 101. The second support layer 22 is disposed corresponding to the bonding area 102, and the third support layer 23 is disposed corresponding to the first area 110. The third support layer 23 is provided with a first opening, and the first support layer 21 is disposed in the first opening. Wherein, an optical phase delay coefficient of the first support layer 21 is less than an optical phase delay coefficient of the second support layer 22.

It should be noted that the first support layer 21 has light transmittance in at least an area corresponding to the light-transmitting area 101. In this embodiment, by adjusting the optical phase delay coefficient of the first support layer 21, the optical phase delay coefficient of the first support layer 21 is less than that of the second support layer 22, so as to reduce or eliminate the phase retardation effect of the first support layer 21 on the light. It prevents the light passing through the light-transmitting area 101 from forming bright and dark stripes, and it is beneficial to improve the lighting effect of the optical components disposed corresponding to the light-transmitting area 101.

Alternatively, an optical phase retardation coefficient of the first support layer 21 is less than or equal to 100, and an optical phase retardation coefficient of the second support layer 22 is greater than 100. It should be noted that through multiple creative experiments and creative calculations on the basis of the experiments, it is proven that when the light phase retardation coefficient of the first support layer 21 is set to be less than or equal to 100, the phase retardation effect on the light will not cause the emitted light to form bright and dark stripes, or have a significant impact on the lighting effect of the optical components under the screen.

Alternatively, the first support layer 21 may be made of materials with a low phase retardation coefficient such as cyclic olefin polymer (COP), tri-cellulose acetate (TAC), colorless polyimide (CPI), or poly (methyl methacrylate) (PMMA).

Further, the thermal expansion coefficient of the second support layer 22 is less than the thermal expansion coefficient of the first support layer 21. It should be noted that the second support layer 22 corresponds to the bonding area 102 of the display panel 10, and because the process of bonding the chip IC or flexible circuit board to the bonding area 102 requires adopting a hot-pressing method, the support layer that supports the bonding area 102 needs to have good heat resistance. In this embodiment, the thermal expansion coefficient of the second support layer 22 is adjusted so that the thermal expansion coefficient of the support layer 22 is less than the thermal expansion coefficient of the first support layer 21. By controlling the expansion amount of the second support layer 22 under the condition of hot pressing, it prevents the chip IC or flexible circuit board from being poorly bonded to the display panel 10 due to excessive expansion of the support layer. It is beneficial to improve the manufacturing yield and reliability of the display device.

Alternatively, the second support layer 22 and the third support layer 23 may be made of materials with a relatively low thermal expansion coefficient such as polyethylene terephthalate (PET).

Figure 6:
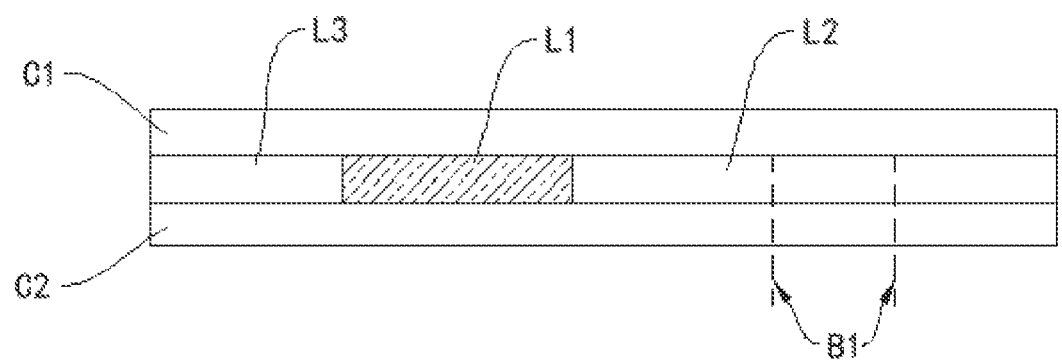
FIG. 6 is a schematic diagram of a structure of a support layer in the display device shown in FIG. 5 during a manufacturing process.

Further, please refer to FIG. 5 and FIG. 6. FIG. 6 is a schematic diagram of a structure of the support layer in the display device shown in FIG. 5 during the manufacturing process. Before the support layer 20 is attached to the display panel 10, a release film C1 and a carrier film C2 are attached to both sides of the support layer 20, respectively. In this embodiment, the method of manufacturing the support layer 20 includes following steps: taking a first raw material including a first splicing layer L1, a second raw material including a second splicing layer L2, and a third raw material including a third splicing layer L3, wherein the first splicing layer L1 corresponds to the first support layer 21, a partial area of the second splicing layer L2 corresponds to the second support layer 22, and a remaining area of the second splicing layer L2 and the third splicing layer L3 correspond to the third support layer 23; cutting the first raw material, the second raw material, and the third raw material according to the size corresponding to the support layer 20 shown in FIG. 5; removing the release film C1 and the carrier film C2 attached on both sides of the first raw material, the second raw material, and the third raw material to obtain the first splicing layer L1, the second splicing layer L2, and the third splicing layer L3; attaching the third splicing layer L3, the first splicing layer L1, and the second splicing layer L2 side by side between the new carrier film C2 and the release film C1 in sequence; using a die-cut mold to perform a half-cutting process along a cutting line B1 of the carrier film C2 side until reaching a bonding surface of the release film C1 and the second splicing layer L2; removing the cut carrier film C2, and attaching the complete carrier film C2 is attached thereto; removing the release film C1, and attaching the third splicing layer L3, the first splicing layer L1, and the second splicing layer L2 integrally to the backside of the display panel 10 according to the positions shown in the embodiment of FIG. 5; removing the carrier film C2, and the manufacturing of the support layer 20 is completed.

Figure 7:
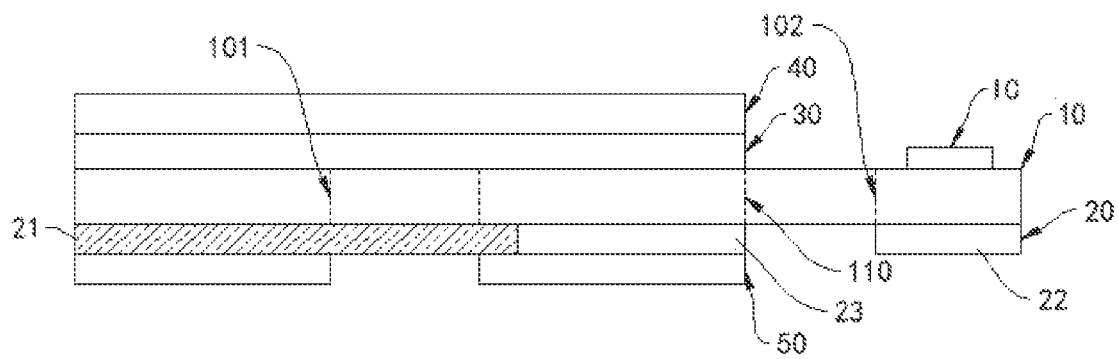
FIG. 7 is a schematic diagram of a fourth structure of a display device provided by an embodiment of the present application.

In one embodiment, please refer to FIG. 7. FIG. 7 is a schematic diagram of a fourth structure of a display device provided by an embodiment of the present application. The display device includes a display panel 10, a support layer 20 disposed on the backside of the display panel 10, a polarizer layer 30 disposed on the display panel 10, a cover plate layer 40 disposed on the polarizer layer 30, and a heat dissipation layer 50 disposed on the lower side of the support layer 20. Wherein, the display panel 10 may be an organic light-emitting diode display panel, the display panel 10 may have flexibility in at least a partial area thereof, and can be bent to the backside of the partial area of the display panel 10. The support layer 20 is used to support and protect the display panel 10 to ensure that the display panel 10 maintains a normal working shape under external pressure or heat. The polarizer layer 30 has a polarization effect and is used to adjust the visual effect of the display panel 10, and the polarizer layer 30 may be a monolithic polarizer. The cover plate layer 40 is used to encapsulate and protect various components in the display device to prevent damage from external forces or corrosion by external water vapor, etc., and the cover plate layer 40 may be a glass cover plate. The heat dissipation layer 50 is used to conduct and dissipate the heat in the display device. It prevents heat accumulation from damaging the display device. The heat dissipation layer 50 can be a composite film layer composed of a composite adhesive layer, a metal copper layer, a polyimide layer, and a foam layer.

The display panel 10 includes a first area 110 and a bonding area 102 connected to the first area 110, and the first area 110 includes a light-transmitting area 101. The first area 110 may be an area with a display function in the display panel 10. Compared with other areas on the display panel 10, the light-transmitting area 101 has higher light transmittance to meet the lighting requirements of the optical components disposed on the lower side of the light-transmitting area 101. The bonding area 102 may not have a display function, and a variety of wiring lines are provided inside. The chip IC or flexible circuit board is bonded to the display panel 10 through the bonding area 102, used to provide a driving signal or a control signal for the display panel 10. The method of bonding the chip IC or flexible circuit board to the display panel 10 is the hot-pressing method. The bonding area 102 can be bent to a backside of the display panel 10 through a bending area to realize the narrow frame design of the display device. The heat dissipation layer 50 includes a third opening corresponding to the light-transmitting area 101.

The support layer 20 is disposed on the backside of the display panel or an opposite side of the light-emitting surface of the display panel 10. The support layer 20 includes a first support layer 21, a second support layer 22, and a third support layer 23. The third support layer 23 is side by side with the first support layer 21, and the third support layer 23 is disposed between the first support layer 21 and the second support layer 22, or the first support layer 21 is disposed between the third support layer 23 and the second support layer 22. The first support layer 21 and the third support layer 23 are disposed corresponding to the first area, a partial area of the first support layer 21 corresponds to the light-transmitting area 101, and the second support layer 22 is disposed corresponding to the bonding area 102. The ratio of an area of the first support layer 21 to an area of the third support layer 23 is adjustable, and it is only necessary to ensure that the light-transmitting area 101 corresponds to the first support layer 21. Wherein, an optical phase delay coefficient of the first support layer 21 is less than an optical phase delay coefficient of the second support layer 22.

It should be noted that the first support layer 21 has light transmittance in at least an area corresponding to the light-transmitting area 101. In this embodiment, by adjusting the optical phase delay coefficient of the first support layer 21, the optical phase delay coefficient of the first support layer 21 is less than that of the second support layer 22, so as to reduce or eliminate the phase retardation effect of the first support layer 21 on the light. It prevents the light passing through the light-transmitting area 101 from forming bright and dark stripes. It is beneficial to improve the lighting effect of the optical components disposed corresponding to the light-transmitting area 101.

Alternatively, an optical phase retardation coefficient of the first support layer 21 is less than or equal to 100, and an optical phase retardation coefficient of the second support layer 22 is greater than 100. It should be noted that through multiple creative experiments and creative calculations on the basis of the experiments, it is proven that when the light phase retardation coefficient of the first support layer 21 is set to be less than or equal to 100, the phase retardation effect on the light will not cause the emitted light to form bright and dark stripes, or have a significant impact on the lighting effect of the optical components under the screen.

Alternatively, the first support layer 21 may be made of materials with a low phase retardation coefficient such as cyclic olefin polymer (COP), tri-cellulose acetate (TAC), colorless polyimide (CPI), or poly (methyl methacrylate) (PMMA).

Further, the thermal expansion coefficient of the second support layer 22 is less than the thermal expansion coefficient of the first support layer 21. It should be noted that the second support layer 22 corresponds to the bonding area 102 of the display panel 10, and because the process of bonding the chip IC or flexible circuit board to the bonding area 102 requires adopting a hot-pressing method, the support layer that supports the bonding area 102 needs to have good heat resistance. In this embodiment, the thermal expansion coefficient of the second support layer 22 is adjusted so that the thermal expansion coefficient of the support layer 22 is less than the thermal expansion coefficient of the first support layer 21. By controlling the expansion amount of the second support layer 22 under the condition of hot pressing, it prevents the chip IC or flexible circuit board from being poorly bonded to the display panel 10 due to excessive expansion of the support layer. It is beneficial to improve the manufacturing yield and reliability of the display device.

Alternatively, the second support layer 22 and the third support layer 23 may be made of materials with a low phase retardation coefficient such as polyethylene terephthalate (PET).

Figure 8:
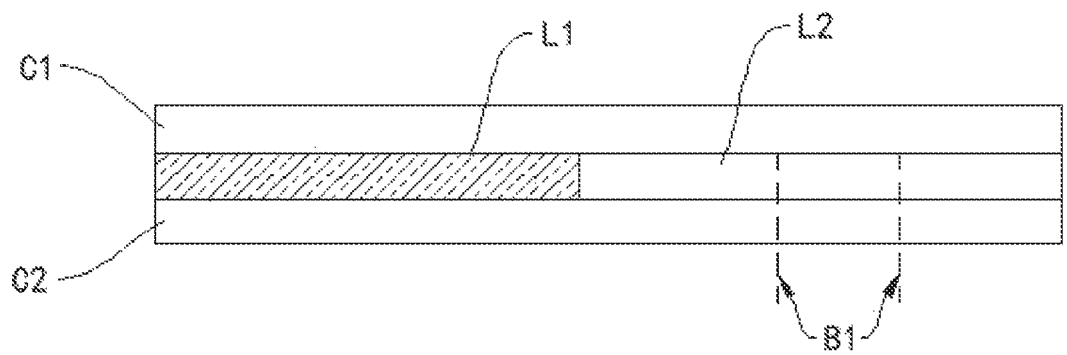
FIG. 8 is a schematic diagram of a structure of a support layer in the display device shown in FIG. 7 during a manufacturing process.

Further, please refer to FIG. 7 and FIG. 8. FIG. 8 is a schematic diagram of a structure of the support layer in the display device shown in FIG. 7 during the manufacturing process. Before the support layer 20 is attached to the display panel 10, a release film C1 and a carrier film C2 are attached to both sides of the support layer 20, respectively.

In this embodiment, the method of manufacturing the support layer 20 includes following steps: taking a first raw material including a first splicing layer L1 and a second raw material including a second splicing layer L2, wherein the first splicing layer L1 corresponds to the first support layer 21, and parts of the areas of the second splicing layer L2 corresponds to the second support layer 22 and the third support layer 23, respectively; removing the release film C1 and the carrier film C2 attached on both sides of the first raw material and the second raw material to obtain the first splicing layer L1 and the second splicing layer L2; attaching the first splicing layer L1 and the second splicing layer L2 side by side between the new carrier film C2 and the release film C1; using a die-cut mold to perform a half-cutting process along a cutting line B1 of the carrier film C2 side until reaching a bonding surface of the release film C1 and the second splicing layer L2; removing the cut carrier film C2, and attaching the complete carrier film C2 thereto; removing the release film C1, and attaching the first splicing layer L1 and the second splicing layer L2 to the backside of the display panel 10 as a whole according to the positions shown in the embodiment of FIG. 7; removing the carrier film C2, and the manufacturing of the support layer 20 is completed.

Figure 9:
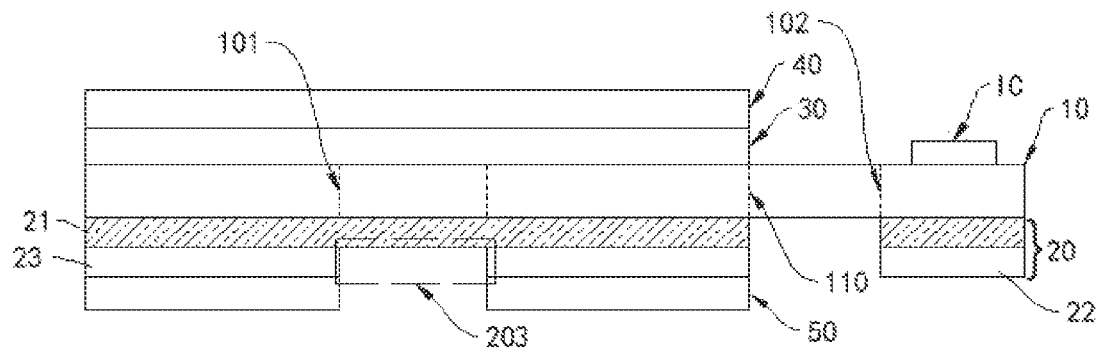
FIG. 9 is a schematic diagram of a fifth structure of a display device provided by an embodiment of the present application.

In one embodiment, please refer to FIG. 9. FIG. 9 is a schematic diagram of a fifth structure of a display device provided by an embodiment of the present application. The display device includes a display panel 10, a support layer 20 disposed on the backside of the display panel 10, a polarizer layer 30 disposed on the display panel 10, a cover plate layer 40 disposed on the polarizer layer 30, and a heat dissipation layer 50 disposed on the lower side of the support layer 20. Wherein, the display panel 10 may be an organic light-emitting diode display panel, the display panel 10 may have flexibility in at least a partial area thereof, and can be bent to the backside of the partial area of the display panel. The support layer 20 is used to support and protect the display panel 10 to ensure that the display panel 10 maintains a normal working shape under external pressure or heat. The polarizer layer 30 has a polarization effect and is used to adjust the visual effect of the display panel 10, and the polarizer layer 30 may be a monolithic polarizer. The cover plate layer 40 is used to encapsulate and protect various components in the display device to prevent damage from external forces or corrosion by external water vapor, etc., and the cover plate layer 40 may be a glass cover plate. The heat dissipation layer 50 is used to conduct and dissipate the heat in the display device. It prevents heat accumulation from damaging the display device. The heat dissipation layer 50 can be a composite film layer composed of a composite adhesive layer, a metal copper layer, a polyimide layer, and a foam layer.

The display panel 10 includes a first area 110 and a bonding area 102 connected to the first area 110, and the first area 110 includes a light-transmitting area 101. The first area 110 may be an area with a display function in the display panel 10. Compared with other areas on the display panel 10, the light-transmitting area 101 has higher light transmittance to meet the lighting requirements of the optical components disposed on the lower side of the light-transmitting area 101. The bonding area 102 may not have a display function, and a variety of wiring lines are provided inside. The chip IC or flexible circuit board is bonded to the display panel 10 through the bonding area 102, used to provide a driving signal or a control signal for the display panel 10. The method of bonding the chip IC or flexible circuit board to the display panel 10 is the hot-pressing method. The bonding area 102 can be bent to a backside of the display panel 10 through a bending area to realize the narrow frame design of the display device. The heat dissipation layer 50 includes a third opening corresponding to the light-transmitting area 101.

The support layer 20 is disposed on the backside of the display panel or an opposite side of the light-emitting surface of the display panel 10. The support layer 20 includes a first support layer 21, a second support layer 22, and a third support layer 23. The first support layer 21 is disposed corresponding to the first area 110 and the bonding area 102, and the second support layer 22 is disposed on the lower side of the first support layer 21 corresponding to the bonding area 102. The third support layer 23 is disposed on the lower side of the first support layer 21 corresponding to the first area 110, and the third support layer 23 is provided with a second opening 203 at a position corresponding to the light-transmitting area 101. An optical phase delay coefficient of the first support layer 21 is less than an optical phase delay coefficient of the second support layer 22.

Alternatively, the first support layer 21 may be disposed only corresponding to the first area 110 or only the light-transmitting area 101, and the second support layer 22 may be directly disposed on the lower side of the bonding area.

It should be noted that the first support layer 21 has light transmittance in at least an area corresponding to the light-transmitting area 101. In this embodiment, by adjusting the optical phase delay coefficient of the first support layer 21, the optical phase delay coefficient of the first support layer 21 is less than that of the second support layer 22, so as to reduce or eliminate the phase retardation effect of the first support layer 21 on the light. It prevents the light passing through the light-transmitting area 101 from forming bright and dark stripes. It is beneficial to improve the lighting effect of the optical components disposed corresponding to the light-transmitting area 101.

Alternatively, an optical phase retardation coefficient of the first support layer 21 is less than or equal to 100, and an optical phase retardation coefficient of the second support layer 22 is greater than 100. It should be noted that through multiple creative experiments and creative calculations on the basis of the experiments, it is proven that when the light phase retardation coefficient of the first support layer 21 is set to be less than or equal to 100, the phase retardation effect on the light will not cause the emitted light to form bright and dark stripes, or have a significant impact on the lighting effect of the optical components under the screen.

Alternatively, the first support layer 21 may be made of materials with a low phase retardation coefficient such as cyclic olefin polymer (COP), tri-cellulose acetate (TAC), colorless polyimide (CPI), or poly (methyl methacrylate) (PMMA).

Further, the thermal expansion coefficient of the second support layer 22 is less than the thermal expansion coefficient of the first support layer 21. It should be noted that the second support layer 22 corresponds to the bonding area 102 of the display panel 10, and because the process of bonding the chip IC or flexible circuit board to the bonding area 102 requires adopting a hot-pressing method, the support layer that supports the bonding area 102 needs to have good heat resistance. In this embodiment, the thermal expansion coefficient of the second support layer 22 is adjusted so that the thermal expansion coefficient of the support layer 22 is less than the thermal expansion coefficient of the first support layer 21. By controlling the expansion amount of the second support layer 22 under the condition of hot pressing, it prevents the chip IC or flexible circuit board from being poorly bonded to the display panel 10 due to excessive expansion of the support layer. It is beneficial to improve the manufacturing yield and reliability of the display device.

Alternatively, the second support layer 22 and the third support layer 23 may be made of materials with a low phase retardation coefficient such as polyethylene terephthalate (PET).

Figure 10:
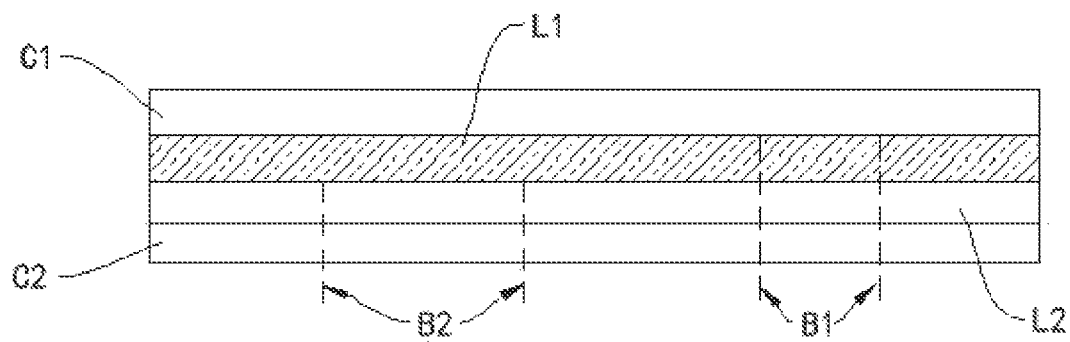
FIG. 10 is a schematic diagram of a structure of a support layer in the display device shown in FIG. 9 during a manufacturing process.

Further, please refer to FIG. 9 and FIG. 10. FIG. 10 is a schematic diagram of the structure of the support layer in the display device shown in FIG. 9 during the manufacturing process. Before the support layer 20 is attached to the display panel 10, a release film C1 and a carrier film C2 are attached to both sides of the support layer 20, respectively. In this embodiment, the method of manufacturing the support layer 20 includes following steps: taking a first raw material including a first splicing layer L1 and a second raw material including a second splicing layer L2; removing the carrier film C2 of the first raw material and the release film C1 of the second raw material; attaching the second splicing layer L2 to the lower side of the first splicing layer L1; using a die-cut mold to perform a first half-cutting along a cutting line B1 of the carrier film C2 side until reaching a bonding surface of the release film C1 and the first splicing layer L1, and using a die-cut mold to perform a second half-cutting along a cutting line B2 until reaching to a bonding surface of the second splicing layer L2 and the first splicing layer L1; removing the cut carrier film C2, and attaching the complete carrier film C2 thereto; removing the release film C1, and attaching the first splicing layer L1 and the second splicing layer L2 integrally to the backside of the display panel 10 according to the positions shown in the embodiment of FIG. 9; removing the carrier film C2, and the manufacturing of the support layer 20 is completed.

Figure 11:
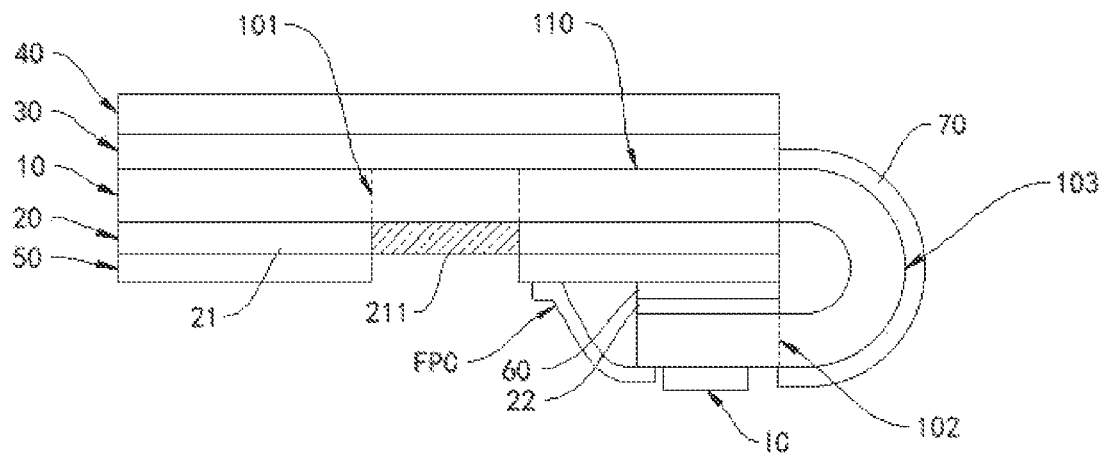
FIG. 11 is a schematic diagram of a sixth structure of a display device provided by an embodiment of the present application.

In one embodiment, please refer to FIG. 11. FIG. 11 is a schematic diagram of a sixth structure of a display device provided in an embodiment of the present application. The display device includes a display panel 10, and the display panel 10 includes a first area 110, a bending area 103, and a bonding area 102. The bending area 103 is connected between the first area 110 and the bonding area 102 so that the first area 110 and the bonding area 102 are arranged oppositely. The first area 110 has a light-transmitting area 101 therein. The first area 110 has a display function, and the bonding area 102 and the bending area 103 may not have a display function. A variety of wiring lines are provided inside the bonding area 102. The chip IC and the flexible circuit board FCP are bonded to the display panel 10 through the bonding area 102, and are used to provide a driving signal or a control signal for the display panel 10. An organic layer 70 is disposed on the outer side of the bending area 103. The organic layer 70 has an insulating and protective effect on the bending area 103.

The display device further includes a support layer 20 disposed on the non-light emitting surface of the display panel 10. The support layer 20 includes a first support layer 21 corresponding to the first area 110 and a second support layer 22 corresponding to the bonding area 102. The first support layer 21 includes a first portion 211 corresponding to the light-transmitting area 101, and the first portion 211 may be part or all of the first support layer 21. The second support layer 22 includes a second portion corresponding to the bonding area 102, and the second portion may be part or all of the second support layer 22. An optical phase retardation coefficient of the first portion 211 is less than an optical phase retardation coefficient of the second portion. In this embodiment, by adjusting the optical phase delay coefficient of the first portion 211, the optical phase delay coefficient of the first portion 211 is less than that of the second portion, or the optical phase retardation coefficient of the first portion 211 is less than the optical retardation coefficient of other areas of the support layer 20 except the first portion 211, so as to reduce or eliminate the phase retardation effect of the support layer on the light. It is beneficial to improve the lighting effect of the optical components disposed corresponding to the light-transmitting area 101.

The display device further includes a polarizer layer 30 disposed on the first area 110 and a cover plate layer 40 disposed on the polarizer layer 30. The polarizer layer 30 has a polarization effect and is used to adjust the visual effect of the display panel 10, and the polarizer layer 30 may be a monolithic polarizer. The cover plate layer 40 is used to encapsulate and protect various components in the display device to prevent damage from external forces or corrosion by external water vapor, etc., and the cover plate layer 40 may be a glass cover plate.

The display device further includes a heat dissipation layer 50 disposed on the lower side of the support layer 20, and the heat dissipation layer 50 includes a third opening corresponding to the light-transmitting area 101. The bending area 103 is connected to the heat dissipation layer 50 through the second support layer 22 and a support pad 60. The heat dissipation layer 50 is used to conduct and dissipate the heat in the display device. It prevents heat accumulation from damaging the display device. The heat dissipation layer 50 may be a composite film layer composed of a composite adhesive layer, a metal copper layer, a polyimide layer, and a foam layer. Alternatively, an optical phase retardation coefficient of the first portion 211 is less than or equal to 100, and the optical phase retardation coefficient of the second portion is greater than 100. The first portion 211 may be made of materials with a low phase retardation coefficient such as cyclic olefin polymer (COP), tri-cellulose acetate (TAC), colorless polyimide (CPI), or poly (methyl methacrylate) (PMMA). Alternatively, the thermal expansion coefficient of the second portion is less than the thermal expansion coefficient of the first portion 211. The second portion may be made of materials with a relatively low thermal expansion coefficient such as polyethylene terephthalate (PET).

Figure 12:
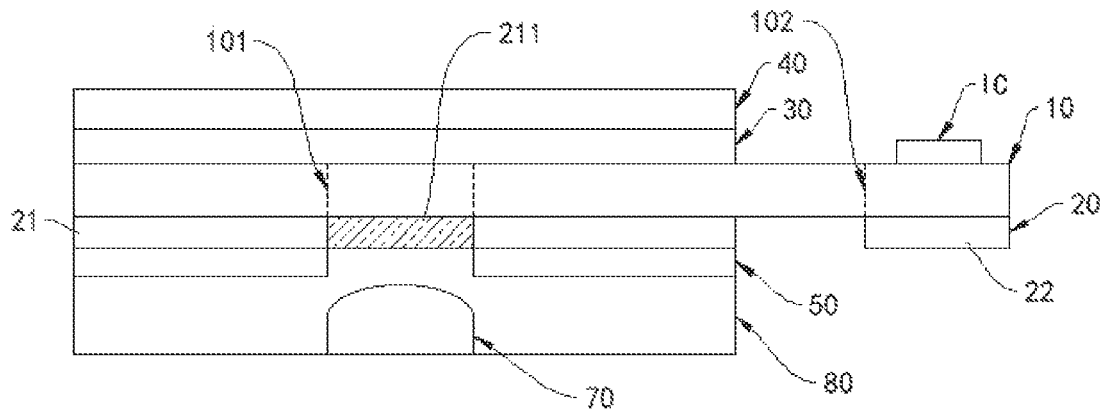
FIG. 12 is a schematic diagram of a structure of a display device shown in FIG. 1 added with an optical component.

Further, please refer to FIG. 12. The display device further includes an optical component 70 and a frame 80. The optical component 70 is fixed on the side of the non-light emitting surface of the display panel 10 by the frame 80, and the position of the optical component 70 corresponds to the position of the light-transmitting area 101. The optical component 70 can collect external light through the light-transmitting area 101 to perform its function.

As mentioned above, the display device provided by the embodiments of the present application includes a display panel and a support layer. The display panel has a light-transmitting area and a bonding area connected to the light-transmitting area. The support layer includes a first support layer and a second support layer, where the first support layer has a first portion corresponding to the light-transmitting area, the second support layer has a second portion corresponding to the bonding area. By configuring an optical phase retardation coefficient of the first portion to be less than an optical phase retardation coefficient of the second portion, the phase retardation effect of the support layer on the light passing through the light-transmitting area is alleviated or eliminated, which prevents light and dark stripes from appearing in the light-transmitting area, and improves the lighting effect of optical components under the screen. In addition, the support layer corresponding to the bonding area of the display panel has a smaller thermal expansion coefficient, which prevents a bonding failure due to an excessive expansion and contraction of the support layer during a bonding process, and improves the manufacturing yield and the reliability of the display device.

It should be noted that although this application is disclosed in specific embodiments, the embodiments are not intended to limit this application. Those of ordinary skill in the art can make various changes and modifications without departing from the spirit and scope of this application. Therefore, the protection scope of this application is subject to the scope defined by the claims.

What is claimed is:

1. A display device, comprising:
    a display panel comprising a light-transmitting area and a bonding area connected to the light-transmitting area; and
    a support layer disposed on a backside of the display panel, wherein the support layer comprises a first support layer and a second support layer, the first support layer comprises a first portion corresponding to the light-transmitting area, the second support layer comprises a second portion corresponding to the bonding area, and an optical phase retardation coefficient of the first portion is less than an optical phase retardation coefficient of the second portion.

2. The display device according to claim 1, wherein the display panel comprises a first area, the first area comprises the light-transmitting area, and the bonding area is connected to the first area.

3. The display device according to claim 2, wherein the support layer further comprises a third support layer disposed corresponding to the first area, the third support layer is provided with a first opening, and the first support layer is disposed in the first opening.

4. The display device according to claim 3, wherein a material of the second support layer and a material of the third support layer both comprise polyethylene terephthalate.

5. The display device according to claim 2, wherein the first support layer is disposed corresponding to the first area, and the first portion is an entire region of the first support layer.

6. The display device according to claim 2, wherein an area of the first portion is greater than an area of the light-transmitting area.

7. The display device according to claim 2, wherein the second portion is an entire region of the second support layer.

8. The display device according to claim 2, wherein the display panel further comprises a bending area connected between the first area and the bonding area, and the first area is disposed opposite to the bonding area.

9. The display device according to claim 2, wherein the support layer further comprises a third support layer disposed corresponding to the first area, the third support layer is located on a lower side of the first support layer, the third support layer is provided with a second opening, and the second opening is provided corresponding to the light-transmitting area.

10. The display device according to claim 2, wherein the first support layer is disposed corresponding to the first area, and the second support layer is disposed corresponding to the bonding area.

11. The display device according to claim 2, wherein the first support layer is disposed corresponding to the first area and the bonding area, the second support layer is disposed corresponding to the bonding area, and the second support layer is located on a side of the first support layer away from the display panel.

12. The display device according to claim 1, further comprising an anti-reflective film on one side of the support layer, wherein the anti-reflective film is disposed corresponding to the light-transmitting area.

13. The display device according to claim 12, wherein a material of the anti-reflective film comprises a submicron-level transparent ceramic material.

14. The display device according to claim 1, wherein a thermal expansion coefficient of the second portion is less than a thermal expansion coefficient of the first portion.

15. The display device according to claim 1, wherein the optical phase retardation coefficient of the first portion is less than or equal to 100.

16. The display device according to claim 1, wherein a material of the first portion comprises at least one of cycloolefin polymer, triacetyl cellulose, colorless polyimide, or poly (methyl methacrylate).

17. The display device according to claim 1, wherein a material of the second portion comprises polyethylene terephthalate.

18. The display device according to claim 1, further comprising a polarizing layer disposed on the display panel, a cover plate layer disposed on the polarizing layer, and a heat dissipation layer disposed on a backside of the support layer, wherein the heat dissipation layer is provided with a third opening corresponding to the light-transmitting area.

19. The display device according to claim 1, further comprising an optical component, and the optical component is disposed corresponding to the light-transmitting area.

20. A display device, comprising:
- a display panel comprising a first area, a bending area connected to the first area, and a bonding area connected to the bending area, wherein the first area comprises a light-transmitting area; and
- a support layer disposed on a backside of the display panel, wherein the support layer comprises a first support layer, a second support layer, and a third support layer, the first support layer is disposed corresponding to the first area and the bonding area, the second support layer is disposed corresponding to the bonding area, and the second support layer is located on a side of the first support layer away from the display panel, the third support layer is disposed corresponding to the first area, and the third support layer is located on the side of the first support layer away from the display panel, the third support layer is provided with an opening corresponding to a position of the light-transmitting area, and an optical phase retardation coefficient of the first support layer is less than an optical phase retardation coefficient of the second support layer.

* * * * *